United States Patent
Piñas et al.

(10) Patent No.: US 6,879,057 B1
(45) Date of Patent: Apr. 12, 2005

(54) ELECTRICAL DISTRIBUTION BOX FOR VEHICLES HAVING TWO NETWORKS WITH DIFFERENT VOLTAGE LEVELS

(75) Inventors: Joan Fontanilles Piñas, Valls (ES); Carles Borrego Bel, Reus (ES); Jordi Bigorra Vives, Valls (ES); Jordi Giro Roca, Reus (ES)

(73) Assignee: Lear Automotive (EEDS) Spain, S.L., Tarragona (ES)

( * ) Notice: Subject to any disclaimer, the term of this patent is extended or adjusted under 35 U.S.C. 154(b) by 0 days.

(21) Appl. No.: 09/980,708
(22) PCT Filed: Jun. 9, 1999
(86) PCT No.: PCT/ES99/00172
  § 371 (c)(1),
  (2), (4) Date: Mar. 29, 2002
(87) PCT Pub. No.: WO00/76812
  PCT Pub. Date: Dec. 21, 2000

(51) Int. Cl.⁷ ................................................ H02G 3/00
(52) U.S. Cl. ..................... 307/10.1; 307/9.1; 361/627; 361/721; 361/818
(58) Field of Search ................................ 307/9.1, 10.1; 361/601, 720, 721, 752, 753, 785, 800, 816, 817, 818, 627

(56) References Cited

U.S. PATENT DOCUMENTS 5,801,925 A  * 9/1998 Boada Fonts ............... 361/752
6,232,674 B1 * 5/2001 Frey et al. ................. 307/10.1

FOREIGN PATENT DOCUMENTS

DE  196 45 944   5/1998
EP   0 337 155   10/1989

* cited by examiner

*Primary Examiner*—Michael Sherry
*Assistant Examiner*—Marc L Shin
(74) *Attorney, Agent, or Firm*—Sughrue Mion, PLLC

(57) ABSTRACT

An electrical distribution box for vehicles with two networks at different voltage levels, comprising centralized electronic signal and power control means, including a microprocessor and electrical protection means, arranged on printed circuit boards in a casing, electrically connected to at least one DC supply source and to parts of the vehicle, incorporating at least one voltage converter (5) inside the distribution box (1), on an independent printed circuit board (10) or in a differentiated area of a supporting plate of the control means, which board (10) or differentiated area is in a clear area of said casing, both in its upper part and in its lower part, electromagnetic screening means having been provided for the converter (5) inside the casing, and thermal dissipation means for the supporting plate of the converter (5).

19 Claims, 2 Drawing Sheets

ELECTRICAL DISTRIBUTION BOX FOR VEHICLES HAVING TWO NETWORKS WITH DIFFERENT VOLTAGE LEVELS

This application is a 371 of PCT/ES99/00172 filed Jun. 9, 1999. The disclosure of which is incorporated herein by reference.

FIELD OF THE INVENTION

The present invention refers to an electrical distribution box for vehicles with two networks operating at two different voltage levels, which box comprises electronic centralised signal and power control means, generally including a microprocessor and electrical protection means, all of which are arranged on one or several printed-circuit boards housed inside a housing, to control variable characteristics of the signal and power currents from inside the vehicle, which box comprises means for electrically connecting it to at least one DC power source and to vehicle parts which are controlled by said electronic means, and in which networks at least one voltage converter is included.

The invention also refers to a vehicle including such an electrical distribution box.

The present invention is useful in the automotive industry and more specifically in the automotive vehicle industry.

BACKGROUND OF THE INVENTION

In modern vehicles there is a tendency towards increasing electrical and electronic equipment resulting in a growing consumption of electrical energy. This makes it advisable to increase the current nominal voltage of the vehicle's electrical system by up to three times, that is, from the current 14 V DC to 42 V DC. However, due to the conveniently calculated and designed current manufacturing and installation infrastructures of electrical systems which already exist in the automotive industry, a sudden transition from one voltage to another is made very difficult.

Increasing the voltage (Volts.) threefold (42 V) involves the reduction of current (A) for the same amount of power. Less amperes mean smaller cable cross-section for supplying current, less weight and lower consumption.

A solution has been proposed in order to avoid said sudden transition, which consists of implementing an electrical and electronic distribution system architecture for the vehicle using networks operating at two different voltage levels, which has been called "dual voltage system". Thus, some components will continue to work at 14 V as until now, so that it will not be necessary to introduce changes in their electrical control and distribution networks, while other components will come to work at 42 V with a more appropriate output and/or optimisation of their performance.

Said dual voltage system may be basically achieved in two ways: either with a single 42 V battery and a unidirectional DC/DC voltage converter from 42 to 14 V; or with two 14 and 42 V batteries respectively, and a bi-directional DC/DC voltage converter from 14 to 42 V or vice versa.

The voltage converter is a key part of the new system in any of the solutions.

Patent WO 97/28366 is an example of the utility of having a dual voltage system in automotive vehicles, describing an ignition system for internal combustion engines which uses a dual voltage electrical supply with a higher voltage to produce a high-intensity electric arc and a lower voltage to cause ionisation. A signal controller analyses the ionisation signal to determine a series of parameters concerning the correct operation of the ignition.

Patent WO 95/13470 describes another ignition system for internal combustion engines supplied by dual voltage supplied by a single supply source and subsequently dualised by a DC/DC voltage converter.

Patent EP-A-0892486 describes an unidirectional voltage converter device to supply dual voltage from a single supply source.

The introduction of the new architecture of the dual voltage system in automotive vehicles carries with it an increase in the complexity of electrical networks. As mentioned hereinbefore, the system includes one or two accumulators or batteries, a voltage converter and one or more distribution boxes in which electronic signal and power control means are centralised, comprising a microprocessor and electrical protection means. The vehicle also comprises an electric generator, usually an alternator, which supplies current to the accumulator or accumulators by means of a rectifier, and which also directly supplies most of the components when the vehicle is running.

Until now, the voltage converter has been situated at some place in the electrical networks, separated from the distribution box or boxes. However, this arrangement has several drawbacks such as: an increased connection cabling which on one hand means a greater voltage drop and on the other hand affects the manufacturing cost, the vehicle's weight and accordingly the fuel consumption; a greater volume occupation inside the already scarce space of the engine compartment; an increased number of component fixing points to the vehicle with greater complexity of assembly; an increase in the number of electrical components exposed to vibrations, which reduces the system's reliability; a redundancy of systems, for example, a microprocessor for the voltage converter and a microprocessor for the distribution box; greater difficulty for thermal dissipation of components arranged in separate boxes; greater difficulty in achieving electromagnetic compatibility due to the incorporation of cables which provide high frequency emissions which produce interference in the components of the distribution box.

References to the subject and objects of this invention are also found in different publications among which the following may be mentioned: J. G. Kassakian "Challenges of the new 42 V architecture and progress on its international acceptance" VDIBerichte 1615, 1998 Baden—Baden; "Road vehicles—Conditions for electrical and electronic equipment for a 42 V powernet—Part 1—General, 42V Working Draft Work Group "Standardization" 1999-Feb.-12, 2000-Apr., "Draft specification for 42 V battery in a 2-voltage vehicle electrical system for BMW and Daimler-Benz SICAN" 29.6.98; MIT Auto-Consortium-42V Net Research Unit #1 "DC/DC converters for Dual Voltage Electrical Systems".

DE-A-19645 944 discloses a control device for an onboard electrical system with at least two batteries which can be charged by a generator and serve to supply various consumers, the control device including a supply netweork element, a bus-capable microcomputer, a direct voltage converter and a short circuit proof end stage.

EP-A-337155 discloses an electrical system for a motor vehicle with two series connected batteries in that two individual mutually independent generators or ta dual generator with two systems for example 12 volts/24 volts is used for voltage generation.

U.S. Pat. No. 5,801,925 the essential features of which are included in the preamble of claim 1, describes an automotive junction box for controlling the flow of power and control signals throughout the interior of an automobile having controllable features and including a casing with separated circuit boards for carrying power from and through the housing and for relaying control signals from the housing for actuating the features.

EXPLANATION OF THE INVENTION

The object of the present invention is to overcome the foregoing drawbacks by situating the DC/DC voltage converter in the same distribution box, thus notably diminishing the cabling, reducing the occupied volume, facilitating assembly, avoiding redundant systems such as anti-vibration devices, anchorings, cooling, generally using a single microprocessor and obtaining better electromagnetic compatibility or better screening to reduce interference. In this way the reliability of the vehicle's electrical system is increased.

These problems are solved according to the features of independent claims 1 and 17.

In accordance with the present invention, a solution is achieved by situating the voltage converter inside the casing itself of one or more of the vehicle's electrical distribution boxes, mounting it on an independent printed circuit board or on a differentiated area of one of the boards of the already existing electronic control means. In order to minimise thermal and electromagnetic interaction between the voltage converter and said electronic control means, it is essential that said independent boards or said differentiated area, are located in an area of said housing that is clear both in the upper and the lower part. Electromagnetic screening means have also been provided for said voltage converter inside the casing and thermal dissipation means for the plate supporting the voltage converter, preferably also including control means for controlling the specific ambient temperature of said inner area of the casing occupied by the voltage converter.

In accordance with a possible arrangement of the control means in the new box, a single microprocessor carries out the control of the voltage converter and said centralised signal and power control, so that redundant components and possible interference sources are eliminated. Also, there is a single common earthing for the supporting plate of the voltage converter and the plate or plates of the electronic control means, so that the supply of loads by the voltage converter is facilitated.

The supporting plate of the voltage converter comprises at least one rapid transient electrical signal conduction track connected to ground to reduce electromagnetic emissions. For greater earthing efficiency, the printed circuit is on only one side of a dielectric substrate, which on the opposite side to said printed circuit comprises a layer of electroconductive material or ground plane connected to ground, to which ground plane said conduction track for a rapid transient electrical signal is connected, which is at least one. In another alternative embodiment of the invention, the plate on which the voltage converter is arranged has the printed circuit on only one side of an electrically insulated substrate of said printed circuit by means of a thin dielectric layer. The substrate is made of a conductive material and has a high thermal conductivity coefficient which constitutes part of said thermal dissipation means and of said means of electromagnetic screening of the voltage converter at its lower part, as well as of the ground plane for its connection to ground.

Inside the housing of the new box, the voltage converter comprises enveloping protections made of plastic material provided with ventilation windows. A metallic deposition or a metallic grille is arranged on said protections, excluding said windows, and constituting part of said electromagnetic screening means of the voltage converter on its upper and side parts.

Typically, the power conduction tracks of the printed circuit board on which the voltage converter is arranged have a thickness of at least 400 $\mu$m. Accordingly, said tracks are suitable for conducting power current and also constitute part of said thermal dissipation means. In order to prevent electric arcs from jumping, said power conduction tracks are sufficiently separated and covered with an insulating film.

At the current input to the box from the vehicle's power generation means at least one fuse has been foreseen (assembly comprising alternator plus accumulator).

In an embodiment of the invention, the voltage converter is arranged on an independent printed circuit board connected to the board or boards of the electronic control means by means of pins of an adequate size to bear the necessary power current.

The voltage converter may be unidirectional or bi-directional. When said voltage converter is an unidirectional DC/DC converter, it is adapted to receive a current at a first voltage level from the vehicle's power generating assembly, made up of an alternator and a first accumulator at said first voltage level, and transform it into a current at a second voltage level to supply loads, and eventually a second accumulator, at said second voltage level. When said converter is a bi-directional DC/DC converter, said second accumulator at a lower second voltage level must be present, said voltage converter being also adapted to supply at least one part of the network to said first voltage level, including said first accumulator, from said second accumulator at the second voltage level.

In the systems currently proposed for the dual voltage architecture in the automotive industry, the first accumulator works at 36 V and together with the current provided by the alternator it supplies a current at 42 V, which supplies the network at said higher voltage level. The network at said lower second voltage level operates at 14 V while the accumulator which works at said second voltage level does so at 12 V.

Said ambient temperature control means which are specific to said inner area of the casing occupied by the voltage converter may be implemented in different ways, such as for example by means of a fan which injects air from outside or from a relatively cold area of the engine compartment or from the passenger compartment to the inside of said casing affecting the area occupied by the voltage converter, said casing including hot air extraction outlets. The air currents present in the engine compartment due to the effect of the vehicle moving forward may also be used. These currents come from inlet grilles for outside air which take it through conduits and/or deflectors to the box casing, the casing also including hot air extraction outlets. Another possible way comprises an air sub-circuit which connects an air conditioning circuit of the vehicle's passenger compartment with the inside of said casing, affecting said area occupied by the voltage converter inside said casing. Finally, another alternative comprises a liquid cooling system which absorbs heat from the plate supporting the voltage converter and releases it to the outside.

A detailed description of specific embodiments of the invention is given below, with reference to the attached drawings, in which.

DETAILED EXPLANATION OF SOME EMBODIMENTS

Figure 1:
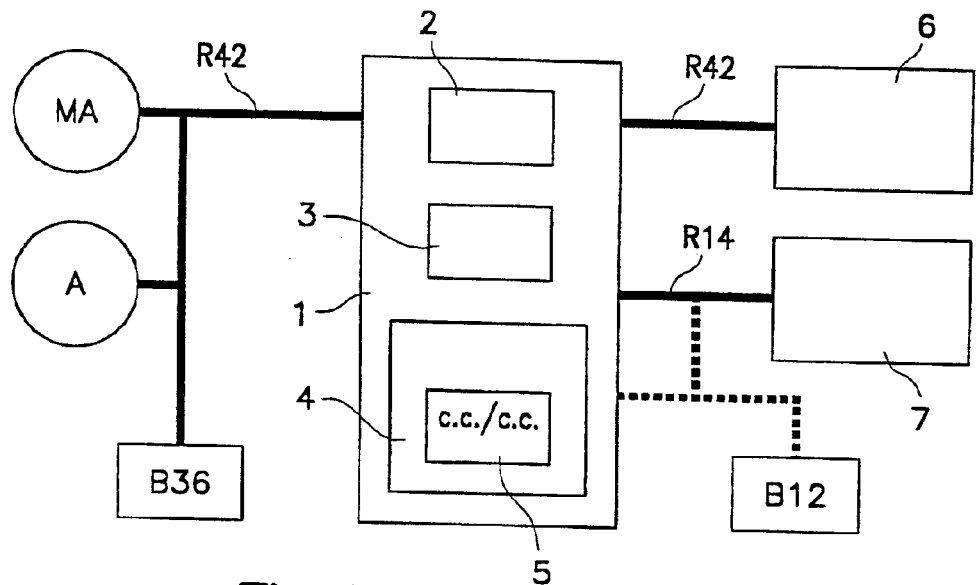
FIG. 1 is an illustrative diagram of the elements which make up the electrical distribution box of the invention and its connections with the main elements of a dual voltage electrical system of a vehicle.

With reference firstly to FIG. 1, the electrical distribution box in accordance with the present invention, represented diagrammatically by square compartment 1, is integrated into an electrical system of a vehicle with networks operating at two voltage levels; a first network R42 which operates at 42 V of DC/DC, which supplies the starter motor SM and other high consumption devices 6, such as for example the air conditioning system, electro-valves, servos, electric operated windows, heated glass, etc. and a second network R14 which operates at 14 V of DC/DC, which supplies other lower consumption devices 7 such as for example, lights, control panel instruments, audio equipment, etc. It must be pointed out that some devices of relatively high consumption will operate transitorily in the said second network R14 for commercial and technical reasons, as in this way they take advantage of the current production infrastructures, distribution of spare parts and repairs, although in the future it is foreseeable that they may be supplied at 42 V. Other loads, for example incandescent lamps or small motors will probably continue to be supplied for a long time at 14 V, which justifies the dual voltage distribution system even more.

The vehicle has a power generating unit made up of an alternator A and at least one first battery B36 or 36 V DC accumulator. The joint action of the alternator A and the first battery B36 supplies the 42 V of the first network R42. There are also networks R42e and R14e, at 42 V and 14 V respectively, which supply corresponding loads 36, 38, only when an ignition relay 30 is activated.

For its part, the electric distribution box 1 basically comprises a power distribution block 2, a signal and power intelligent management block 3 (monitoring and control logic), such as the state of the art boxes, and also a voltage conversion block 4 which includes a voltage converter 5.

With the elements described up to now, that is, only providing current at 36 V by means of said first battery B36, said voltage converter 5 is unidirectional, converting the 42 V DC of the first network R42 into the 14 V DC of said second network R14. However, due to the foreseeable gradual implementation of the dual voltage electrical system in the automotive industry, vehicles with the old system of single network at 14 V and vehicles with the new system of two networks at 14 and 42 V will co-exist for a relatively long time. For this reason and in order to observe certain articles of current regulations, for example, that the battery of an auxiliary vehicle may be used to supply the starter motor of a vehicle whose battery has run down, by connecting the corresponding terminals of the respective batteries with auxiliary cables, a second battery B12 is introduced into the dual voltage system which provides current at 12 V DC. In this case, the voltage converter 5 is bi-directional, that is, it is capable to convert current of 42 V to 14 V and also to raise current from 14 to 42 V. The use of a second battery associated with a bi-directional voltage converter also offers greater assurance of a supply for the electrical system at all times, even if one of the batteries fails.

Figure 2:
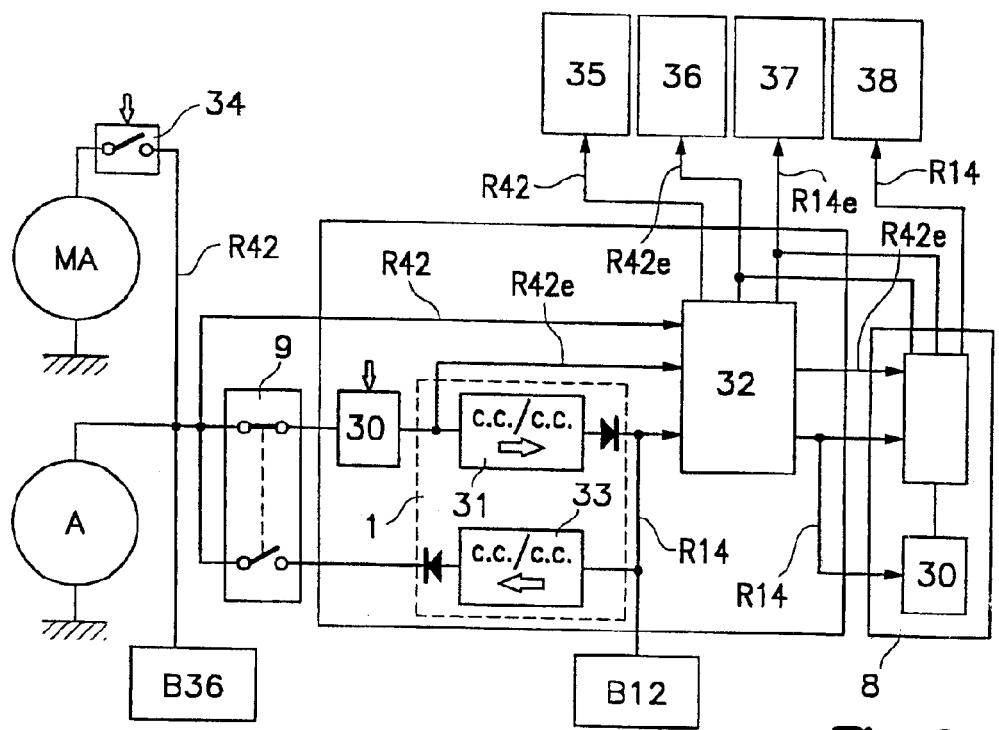
FIG. 2 is a simplified illustrative diagram (only power connections) of the power current flows in a dual voltage electrical system of a vehicle, comprising the electrical distribution box of the invention, including a bi-directional voltage converter, in combination with a second electrical distribution box without a voltage converter, thus implementing a centralised conversion system.

With reference now to the example in FIG. 2, in which the current flows are represented, a network R42 operating at 42 V DC and a network R14 operating at 14 V DC may be distinguished. In said FIG. 2, an electrical distribution box 1 in accordance with the present invention, provided with a bi-directional voltage converter, operates in a dual voltage electrical system in combination with a second distribution box 8 without a voltage converter, that is, of the conventional type. In this example, the alternator A, together with the first 36 V DC battery B36, supplies current at 42 V to the box 1 through a power switch 9. Inside the box 1 there is an ignition relay 30 in the 42 V network which authorises the passage of current either to a descending section 31 of the voltage converter, which transforms it from 42 to 14 V DC/DC before introducing it into a control section 32, or introduces it into said control section 32 directly at 42 V.

Moreover, a second 12 V DC battery B12 introduces current into the box 1 with a direct connection to the 14 V conduit at the output of the said descending section 31 of the voltage converter and an input to a raising section 33 of the voltage converter, which transforms it from 14 to 42 V DC/DC before taking it, through the said power switch 9, to the 42 V network R42, which has a shunt to the starter motor SM, at the input of which there is a controlled switch 34.

A line emerges from the control section 32 which supplies loads at 42 V 35, a line which supplies ignition loads at 42 V 36 only when the said ignition relay 30 is connected, and another line which supplies loads at 14 V 37. From the control section 32 the following lines also emerge: a line at 42 V which only operates when it is connected to said ignition relay 30 and a line at 14 V to a second distribution box 8 without voltage converter, which includes, at the input of the 14 V line another ignition relay 30 at 14 V. From said second distribution box 8 a connection emerges to said line which supplies said ignition loads at 42 V 36 only when said ignition relay 30 is connected, a connection to said line which supplies said loads at 14 V 37 and another line which supplies ignition loads at 14 V 38 only when said ignition relay 30 is activated.

Inclusion of the voltage converter, whether unidirectional or bi-directional, inside the distribution box 1 poses several problems, especially with reference to heat generation and electromagnetic interference on the part of the voltage converter which may disadvantageously affect the operation of the other components of the box 1.

Figure 3:
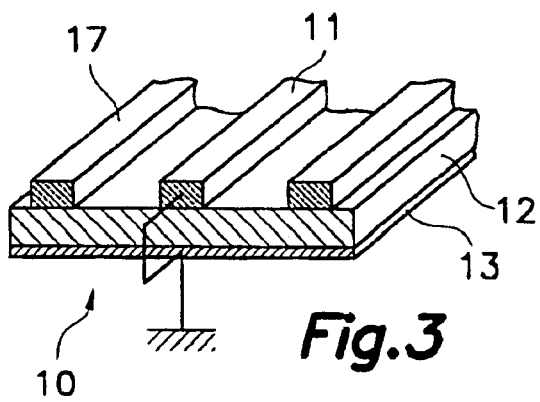
FIGS. 3 and 3a are detailed, partial schematic perspective views which respectively show examples of earthing with and without screening effect.
Figure 4:
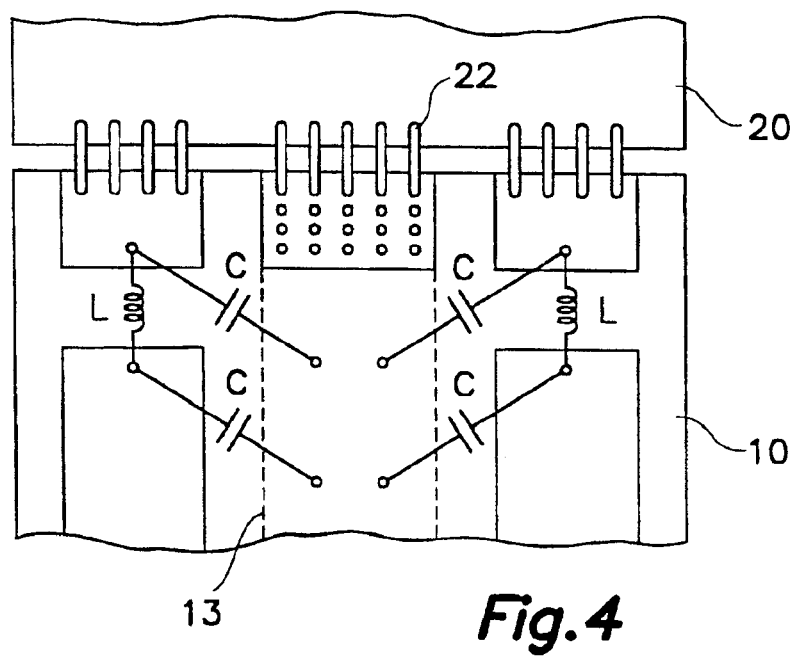
FIG. 4 is a schematic partial plan view which illustrates the connections between the supporting plate of the voltage converter and the plates of the remaining components of the box of the invention, with a system of filters against interference.
Figure 5:
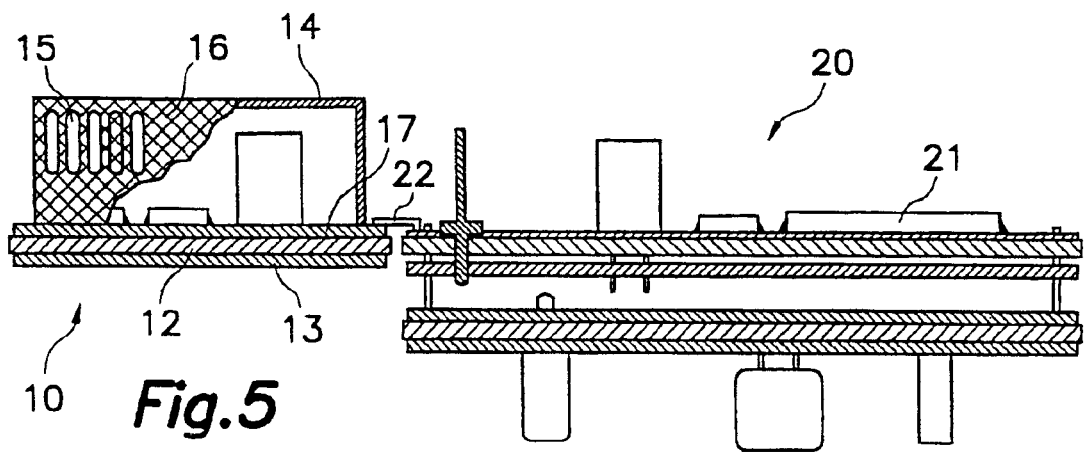
FIG. 5 is a side view in longitudinal cross-section of the elements which make up the electrical distribution box of the invention, showing protections for the voltage converter.

In FIGS. 3 to 5, several embodiments are illustrated which aim at overcoming these drawbacks. Firstly, with reference to FIG. 5, said voltage converter 5 is situated inside a casing (not shown) of the distribution box 1, on an independent printed circuit board 10 or on a differentiated area of one of some plates 20 of the centralised voltage and power control means, said independent board or said differentiated area being in a clear area of said casing both in its upper part and in its lower part in order to minimise thermal and electromagnetic interaction between said voltage converter 5 and said electronic control means. A series of measures has also been provided which as a whole constitute electromagnetic screening means for said voltage converter 5 inside the casing, and thermal dissipation means for the supporting plate of the voltage converter 5.

Inside the box 1, preferably a single microprocessor 21 controls the voltage converter 5 and said centralised signal and power control so that redundant components and possible interference sources are eliminated, there being a single common earthing for the supporting plate of the converter 5 and the plate or plates of the electronic control means, so that the supply of loads by the voltage converter 5 is facilitated.

Figure 3A:
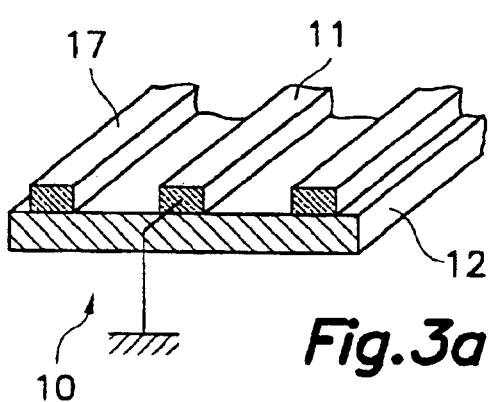

With reference to FIGS. 3 and 3a, said independent board 10 or differentiated area at least comprises one rapid transient electric signal conduction track 11 connected to ground to reduce electromagnetic emissions. In a preferred embodiment, said independent board 10 or differentiated area has the printed circuit on a single side of a dielectric substrate 12 which on the opposite side to said printed circuit comprises a layer 13 of electroconductive material connected to ground, forming a ground plane whose layer 13 is also connected to said rapid transient electric signal conduction track 11. Said layer 13 preferably constitutes a substrate, electrically insulated from said printed circuit, made of a high thermal conductivity coefficient material which helps to dissipate the heat generated by the voltage converter 5, constituting part of said thermal dissipation means. Said layer 13 or substrate also helps to prevent the propagation of electromagnetic emissions through the lower part of the voltage converter 5, forming part of said electromagnetic screening means.

Said electromagnetic screening means are completed by means of enveloping protections 14, made of plastic material, for the voltage converter 5, provided with ventilation windows 15. A metallic deposition layer or a metallic grille 16 is arranged on said protections excluding said windows 15, which helps to prevent the propagation of electromagnetic emissions by the upper and side parts of the voltage converter 5.

Power conduction tracks 17 of the printed circuit board on which the voltage converter 5 is arranged have a thickness of at least 400 μm, suitable for a power current conduit which will prevent heating and also help to dissipate the heat generated by the converter 5, for which reason it also forms part of said thermal dissipation means. To prevent jumping of electric arcs, said tracks 17 are sufficiently separated and covered by an insulating film (not shown).

When the voltage converter 5 is arranged on an independent circuit board 10 as shown in FIG. 4, its connections with the board or boards 20 of the electronic control means are carried out by means of pins 22 of appropriate size to support the necessary power current. The input and output circuits of the board 10 which supports the voltage converter include by-pass filters made up of coils L and condensers C to eliminate interference between the circuits of both boards 10 and 20.

To extract the heat from inside the casing of the electrical distribution box 1, ambient temperature control means of said casing (not shown) are also provided, which specifically affect the inner area of the casing occupied by the voltage converter 5.

Said ambient temperature control means comprises embodiments in which said cooling is carried out by air, incorporating a fresh intake air conduit to the casing and a hot air outlet conduit from the same. Said fresh air may have different origins and may be fan-assisted to circulate in different ways. In a first example, a fan injects fresh air taking it from outside or from a relatively cool area of the engine or from the passenger compartment. In another example, the fresh air comes from an air sub-circuit which joins with an air-conditioning circuit from the passenger compartment of the vehicle. In another example, the air currents present in the engine compartment, which are produced by the effect of the vehicle moving forward and come through air intake grilles from the outside, are used by means of conduits and/or deflectors to direct them to the inside of said casing.

In another variant, said ambient temperature control means comprises a liquid cooling system which absorbs heat from the plate supporting the voltage converter 5 and releases it to the outside.

What is claimed is:

1. An electrical distribution box for vehicles with two networks at different voltage levels, comprising electronic centralised signal and power control means, including a microprocessor (21) and electric protection means, all of which are arranged on one or several printed circuit boards housed inside a casing to control variable characteristics of the signal and power currents through the vehicle, which box (5) comprises means for its electrical connection to at least one DC power source and to parts of the vehicle which are controlled by said electronic centralised signal and power control means, characterised in that:

said networks include at least one voltage converter;

said voltage converter (5) is located inside said casing of said distribution box (1) on an independent printed circuit board (10) or on a separated area of one of said boards of the control means, said independent board (10) or said separated area being arranged in a part of said casing which is empty both above and below thereof to minimise thermal and electromagnetic interaction between the converter (5) and said electronic control means;

electromagnetic screening means for said converter (5) and thermal dissipation means for the supporting plate of the converter (5) are provided inside said casing;

a single microprocessor (21) controls the voltage converter (5) and said centralised signal and power control; and said independent board (10) or separated area comprises at least one rapid transient electrical signal conduction path (11) connected to ground to reduce electromagnetic emissions.

2. A distribution box in accordance with claim 1, characterised in that it comprises a single common earthing for the supporting plate of the voltage converter (5) and the plate or plates of the electronic control means, so that the supply of loads by the converter (5) is facilitated.

3. A distribution box in accordance with claim 1, characterised in that said independent board (10) or separated area has the printed circuit on only one side of a dielectric substrate (13) comprising, on the opposite side to said printed circuit, a layer (13) of electroconductive material connected to ground, to which layer (13) said at least one rapid transient electrical signal conduction (11) is in turn connected.

4. A distribution box in accordance with claim 1, characterised in that the board upon which the voltage converter (5) is arranged has the printed circuit on only one side of an electrically insulated substrate, made of a material with a high thermal conductivity coefficient, which constitutes part of said voltage converter (5) thermal dissipation means and part of said electromagnetic screening means corresponding to a supporting area of said converter, and providing a ground plane for connection to ground.

5. A distribution box in accordance with claim 4, characterised in that it comprises enveloping protections (14) made of plastic material for the voltage converter (5), provided with ventilation windows (15), and on these protections (14) a layer of metallic deposition or metallic grille (16) is disposed excluding said windows (15) and constituting another part of said electromagnetic screening means of the voltage converter (5) corresponding to its upper and side parts.

6. A distribution box in accordance with claim 1, characterised in that power conducting tracks (17) of the printed circuit board on which the voltage converter (5) is arranged have a thickness of at least 400 μm suitable for a power current conduit and also constituting part of said thermal dissipation means.

7. A distribution box in accordance with claim 6, characterised in that said tracks (17) are sufficiently separated and covered by an insulating film to prevent the jumping of electric arcs.

8. A distribution box in accordance with claim 1, characterised in that it comprises at least one fuse at the current input to the box (1) from the vehicle's power generation means.

9. A distribution box in accordance with claim 1, characterised in that the voltage converter (5) arranged on an independent printed circuit board (10) is connected to the board or boards of the electronic control means by means of pins (22) which are of an appropriate size to bear the necessary power current.

10. A distribution box in accordance with claim 1, characterised in that said voltage converter (5) is an unidirectional DC/DC voltage converter adapted to receive a current at a first voltage level from the vehicle's power generating unit, made up of an alternator (A) and a first accumulator (B36) at said first voltage level, and transform it into a current at a second voltage level to supply loads, and eventually a second accumulator (B12) at said second voltage level.

11. A distribution box in accordance with claim 1, characterised in that said voltage converter (5) is a bi-directional DC/DC voltage converter adapted to receive a current at a first voltage level from the vehicle's power generating unit, made up of an alternator (A) and a first accumulator (B36) at said first voltage level, and transform it into a current at a second lower voltage level to supply some loads and a second accumulator (B12) at said second voltage level, said voltage converter (5) being also adapted to allow the supply of at least a part of a network (R42) at said first voltage level, including said first accumulator (B36), from said second accumulator (B12) at said second voltage level.

12. A distribution box in accordance with claim 1, characterised in that it further comprises ambient temperature control means, which are specific to said inner area of the casing occupied by the voltage converter (5).

13. A distribution box in accordance with claim 12, characterised in that said ambient temperature control means comprises a fan which injects air from the outside, from a relatively cool area of the engine compartment or from the passenger compartment, to the inside of said casing, affecting said area occupied by the voltage converter (5), said casing including hot air extraction outlets.

14. A distribution box in accordance with claim 12, characterised in that said ambient temperature control means comprises an air sub-circuit which joins an air-conditioning circuit of the passenger compartment of the vehicle with the inside of said casing, affecting said area occupied by the voltage converter (5), said casing including hot air extraction outlets.

15. A distribution box in accordance with claim 12, characterised in that said ambient temperature control means comprises conduits and/or deflectors for taking and using the air currents present in the engine department as a result of the effect of the vehicle moving forwards, which come through air intake grilles from outside and affect, inside said casing, said area occupied by the voltage converter (5), said casing including hot air extraction outlets.

16. A distribution box in accordance with claim 12, characterised in that said ambient temperature control means comprises a liquid cooling system which absorbs heat from the supporting plate of the voltage converter (5) and dissipates it outside the box.

17. A vehicle with electrical networks operating at two different voltage levels characterised in that it comprises at least an electrical distribution box (1) in accordance with any one of claims 1 to 16.

18. A vehicle in accordance with claim 17, characterised in that it comprises a plurality of said boxes (1), for controlling and supplying specific loads close to the same, and situated in different parts of the vehicle such as the engine compartment, passenger compartment and boot.

19. A vehicle in accordance with claim 17, characterised in that it further comprises in combination, at least one centralised electrical distribution box (8) without a voltage converter (5).

* * * * *